United States Patent
Mika et al.

(10) Patent No.: US 9,118,333 B1
(45) Date of Patent: Aug. 25, 2015

(54) SELF-ADAPTIVE MULTI-MODULUS DIVIDERS CONTAINING DIV2/3 CELLS THEREIN

(71) Applicant: Integrated Device Technology, Inc., San Jose, CA (US)

(72) Inventors: Benedykt Mika, Chandler, AZ (US); Pengfei Hu, Chandler, AZ (US)

(73) Assignee: INTEGRATED DEVICE TECHNOLOGY INC., San Jose, CA (US)

( * ) Notice: Subject to any disclaimer, the term of this patent is extended or adjusted under 35 U.S.C. 154(b) by 76 days.

(21) Appl. No.: 14/013,599

(22) Filed: Aug. 29, 2013

(51) Int. Cl.
| | |
|---|---|
| H03K 21/00 | (2006.01) |
| H03K 23/00 | (2006.01) |
| H03K 23/70 | (2006.01) |
| H03K 23/68 | (2006.01) |
| H03K 23/66 | (2006.01) |

(52) U.S. Cl.
CPC .............. *H03K 23/70* (2013.01); *H03K 23/667* (2013.01); *H03K 23/68* (2013.01)

(58) Field of Classification Search
None
See application file for complete search history.

(56) References Cited

U.S. PATENT DOCUMENTS

| | | | |
|---|---|---|---|
| 6,008,703 A | 12/1999 | Perrott et al. | |
| 6,501,816 B1 | 12/2002 | Kouznetsov et al. | |
| 6,760,397 B2 | 7/2004 | Wu et al. | |
| 7,298,810 B2 * | 11/2007 | Ke | 377/48 |
| 7,327,820 B2 | 2/2008 | Meninger et al. | |
| 7,564,276 B2 * | 7/2009 | Narathong et al. | 327/117 |
| 7,924,069 B2 * | 4/2011 | Narathong et al. | 327/117 |
| 8,552,770 B2 * | 10/2013 | Cavin | 327/115 |
| 8,559,587 B1 | 10/2013 | Buell et al. | |
| 8,565,368 B1 * | 10/2013 | Chen et al. | 377/47 |
| 2007/0160179 A1 * | 7/2007 | Narathong et al. | 377/47 |
| 2014/0003569 A1 * | 1/2014 | Martin | 377/48 |
| 2014/0312936 A1 * | 10/2014 | Abdel-Haleem et al. | 327/118 |

OTHER PUBLICATIONS

Perrott, 6.976 High Speed Communication Circuits and Systems—Lecture 14—High Speed Frequency Dividers; MIT Open Courseware; Massachusetts Institute of Technology, Copyright © 2003 by Michael H. Perrott; 46 pages.

Perrott, 6.976 High Speed Communication Circuits and Systems—Lecture 15—Integer-N Frequency Synthesizers; MIT Open Courseware; Massachusetts Institute of Technology, Copyright © 2003 by Michael H. Perrott; 52 pages.

Perrott, 6.976 High Speed Communication Circuits and Systems—Lecture 18—Design and Simulation of Frequency Synthesizers; MIT Open Courseware; Massachusetts Institute of Technology, Copyright © 2003 by Michael H. Perrott; 37 pages.

(Continued)

*Primary Examiner* — Tuan T Lam
(74) *Attorney, Agent, or Firm* — Myers Bigel, et al.

(57) ABSTRACT

Integrated circuit devices include programmable dividers, such as fractional-N dividers, which can utilize multi-modulus dividers (MMD) therein. A multi-modulus divider includes a cascaded chain of div2/3 cells configured to support a chain length control operation that precludes generation of an intermediate divisor in response to a change in value of a chain length control byte P<n:0> during an update time interval and may even fully turn off one or more of the div2/3 cells not participating in a divide-by-N operation, where N is a positive integer greater than one. The div2/3 cells are configured to include a modulus input terminal and a modulus output terminal and the chain length control operation is independent of the magnitude of the signals provided to the modulus input terminals of the div2/3 cells.

18 Claims, 6 Drawing Sheets

(56) References Cited

OTHER PUBLICATIONS

Yang et al. "A Dual-Mode Truly Modular Programmable Fractional Divider Based on a 1/1.5 Divider Cell", IEEE Microwave and Wireless Components Letters, vol. 15, No. 11, pp. 754-756, Nov. 2005.

Ashour et al. "Extended division range 2/3 chain frequency divider with dynamic control word", *Proceedings of 2010 IEEE International Symposium on Circuits and Systems (ISCAS)*, 4141-4144, May 30, 2010-Jun. 2, 2010.

Ray et al. "A 13GHz Low Power Multi-Modulus Divider Implemented in 0.13μm SiGe Technology", *IEEE Topical Meeting on Silicon Monolithic Integrated Circuits in RF Systems, SiRF '09*, Jan. 19-21, 2009, 1-4.

Sandireddy et al. "A Generic Architecture for Multi-Modulus Dividers in Low-Power and High-Speed Frequency Synthesis", *2004 Topical Meeting on Silicon Monolithic Integrated Circuits in RF Systems*, 2004, 243-246.

Vaucher et al. "A Family of Low-Power Truly Modular Programmable Dividers in Standard 0.35-μm CMOS Technology", *IEEE Journal of Solid-State Circuits*, vol. 35, No. 7, Jul. 2000, 1039-1045.

\* cited by examiner

SELF-ADAPTIVE MULTI-MODULUS DIVIDERS CONTAINING DIV2/3 CELLS THEREIN

FIELD OF THE INVENTION

The present invention relates to integrated circuit devices and, more particularly, to multi-modulus divider circuits used for clock generation.

BACKGROUND OF THE INVENTION

Phase-locked loop (PLL) integrated circuits are frequently used to generate clock signals for synchronous integrated circuit systems. As will be understood by those skilled in the art, PLL integrated circuits may multiply a reference clock frequency by some number to thereby generate a relatively high frequency clock. This multiplying number can be a fractional number if fractional dividers are utilized in a feedback loop of the PLL. One typical technique to implement a fractional divider is to utilize a multi-modulus divider (MMD) with a delta-sigma modulator (DSM), which outputs a sequence of integer numbers having a fractional average value. The MMD uses these integer numbers as divisors. For example, these integer numbers can be any one of [N1, N2], where N1 and N2 are determined by the desired fractional number and the DSM order. To achieve proper operation, there should be no delays or intermediate divisors of the MMD. One example of fractional divider is disclosed in commonly assigned U.S. application Ser. No. 13/425,761, filed Mar. 21, 2012, entitled "Fractional-N Dividers Having Divider Modulation Circuits Therein with Segmented Accumulators," the disclosure of which is hereby incorporated herein by reference.

An example of a programmable MMD with extended range is disclosed in an article by Cicero S. Vaucher et al., entitled "A Family of Low-Power Truly Modular Programmable Dividers in Standard 0.35-um CMOS Technology," IEEE JSSC, Vol. 35, No. 7, July 2000. A shown by FIGS. 1-2, a portion of this MMD 100 includes several stages of div2/3 cells 110 and logic circuits (e.g, OR gates, inverters). Each div2/3 cell includes four (4) level-sensitive D-type latches and three (3) AND gates, connected as illustrated. When signal MODin=1 and signal P=1, a divide-by-3 function is realized so that the states 201, 202 change as follows: $(0,1) \rightarrow (1,1) \rightarrow (0,1)$. In addition, when signal MODin=0 and signal P=X (i.e., X=0 or 1), a divide-by-2 function is realized so that the states 201, 202 of corresponding D-type latches change as follows: $(0,1) \rightarrow (1,1) \rightarrow (0,1)$. Thus, when node 201 is logic 1, MODout repeats the value of MODin and when node 201 is logic 0, MODout is logic 0, with the latch states changing at negative edges of signal Fin. As shown by FIG. 1, each stage of div2/3 cells samples its own MODin and generates its own MODout, with the rightmost input MODin being set high to a logic "1" value. Based on this configuration, each MODout signal is a positive pulse with the pulse width being one period of its own Fin. During this period, each stage has one chance to perform a "check", when its MODin is high, to determine whether it is supposed to function as a divide-by-3 cell or a divide-by-2 cell depending on its input P. The period of Fout (i.e., Tout) is related to the period of Fin (i.e., Tin) as follows:

$$T\text{out}=T\text{in}(P{<}0{>}+P{<}1{>}2^1+\ldots+P{<}n{-}1{>}2^{n-1}+P{<}n{>}2^n),$$

which means the divisor is equivalent to the binary number $P{<}n{:}0{>}(2 \leq P{<}n{:}0{>} \leq 2^{n+1}-1)$. Unfortunately, one problem with the MMD of FIGS. 1-2 is that when a new $P{<}n{:}0{>}$ is loaded, the divisor does not directly change to the new divisor, but can get an uncertain intermediate value before becoming the new value. This property of the MMD of FIGS. 1-2 is not acceptable for fractional divider applications where any discrepancy will result in an error division ratio. U.S. Pat. No. 6,760,397 to Wu et al. and U.S. Pat. No. 6,501,816 to Kouznetsov et al. also disclose efforts to develop multi-modulus dividers for programmable frequency divider and fractional-N divider applications.

SUMMARY OF THE INVENTION

Integrated circuit devices according to embodiments of the invention may include programmable dividers, such as fractional-N dividers, which can utilize multi-modulus dividers (MMD) therein. According to some of these embodiments of the invention, a multi-modulus divider includes a cascaded chain of div2/3 cells configured to support a chain length control operation that precludes generation of an intermediate divisor in response to a change in value of a chain length control byte P<n:0> during an update time interval and may even fully turn off one or more of the div2/3 cells not participating in a divide-by-N operation, where N is a positive integer greater than one. In some embodiments of the invention, the div2/3 cells are configured to include a modulus input terminal (MODin) and a modulus output terminal (MODout) and the chain length control operation is independent of the magnitude of the signals provided to the modulus input terminals of the div2/3 cells. Moreover, with respect to the cascaded chain, a modulus input terminal of each of a plurality of the div2/3 cells may be directly connected to a modulus output terminal of another one of the plurality of div2/3 cells.

According to still further embodiments of invention, each of the div2/3 cells may include a stage number control (SNC) terminal and an SNC terminal of at least one of the div2/3 cells receives a signal derived from a Boolean combination of a plurality of bits of the chain length control byte. For example, the multi-modulus divider can be configured so that an SNC terminal of at least one of the div2/3 cells receives a signal derived from a logical OR combination of two bits of the chain length control byte.

According to additional embodiments of the invention, a multi-modulus divider is provided with a cascaded chain of div2/3 cells, which are configured to support a chain length control operation in response to a chain length control byte. This cascaded chain includes a plurality of div2/3 cells having respective stage number control (SNC) terminals that receive respective SNC signals, which are each derived exclusively from respective Boolean combinations of a plurality of bits of the chain length control byte. Moreover, each of the div2/3 cells includes a modulus input terminal and a modulus output terminal and the chain length control operation is independent of the magnitude of the signals provided to the modulus input terminals of the div2/3 cells. A modulus input terminal of each of a plurality of the div2/3 cells may also be directly connected to a modulus output terminal of another one of the plurality of div2/3 cells. The multi-modulus divider is further configured so that all switching components within the div2/3 cells in the cascaded chain that do not participate in division in response to the chain length control byte are turned off and held inactive in response to the chain length control byte.

According to still further embodiments of the invention, an integrated circuit device includes a multi-modulus divider containing a cascaded chain of div2/3 cells, which are collectively configured to support a chain length control operation that precludes generation of any intermediate divisor in response to a change in value of a chain length control byte during an update time interval. This update time interval occurs when all modulus input signals (MODin) associated with active ones of the div2/3 cells participating in a divide-by-N operation are in a first logic state, where N is a positive integer greater than one. The update time interval may also occur when all MODin signals associated with inactive ones of the div2/3 cells not participating in the divide-by-N operation are held in a second logic state, opposite the first logic state.

DETAILED DESCRIPTION OF EMBODIMENTS

Figure 1:
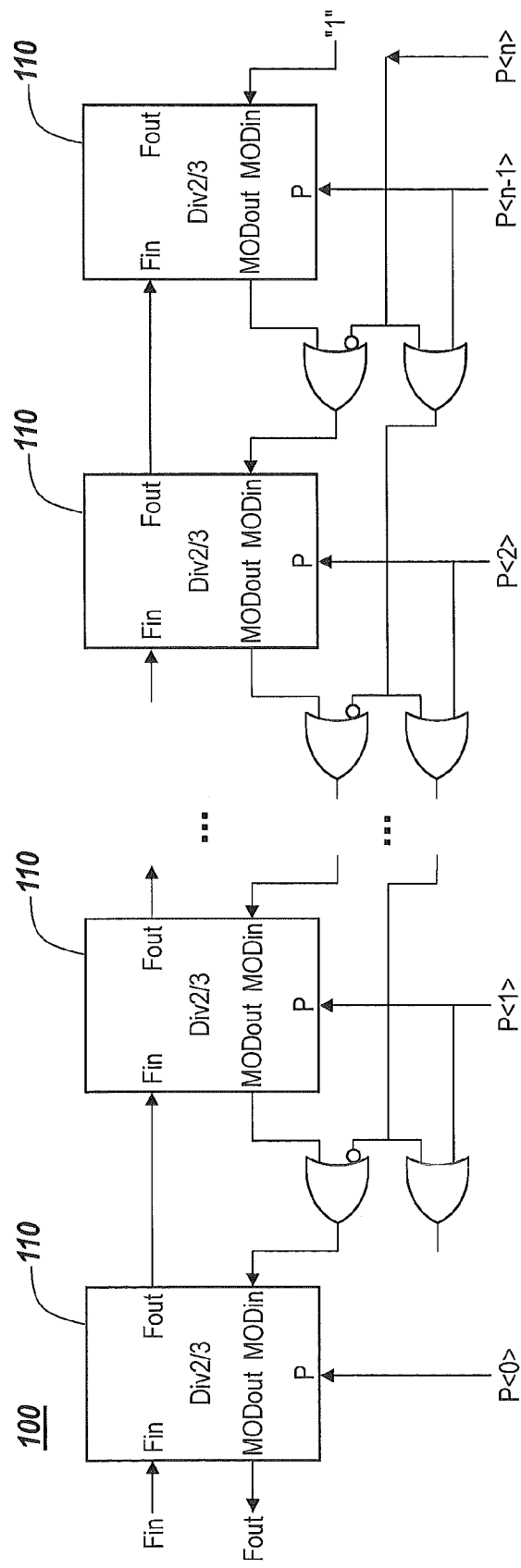
FIG. 1 is an electrical schematic of a multi-modulus divider (MMD) according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
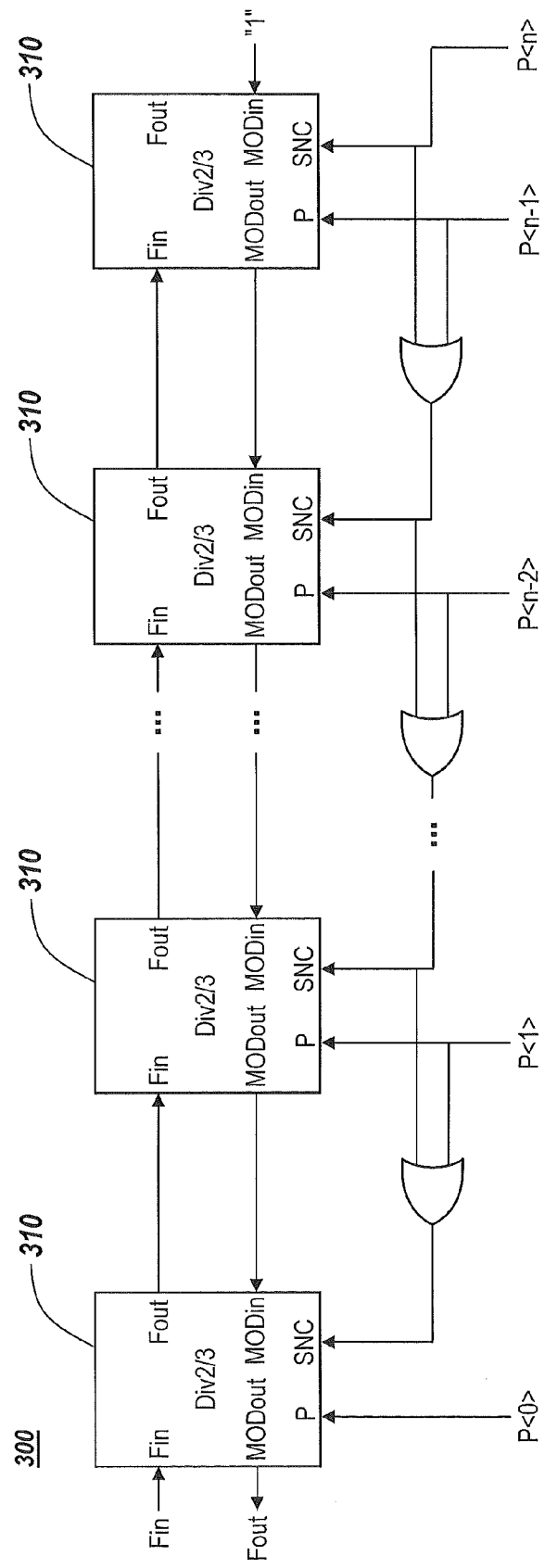
FIG. 3 is an electrical schematic of a 4-stage multi-modulus divider (MMD) having a cascaded chain of div2/3 cells therein, according to an embodiment of the invention.

Referring now to FIG. 3, a multi-modulus divider (MMD) 300 according to an embodiment of the present invention is illustrated as including a cascaded chain of div2/3 cells 310 (i.e., stages) and a corresponding chain of two-input OR gates, connected as illustrated. The number "n" of div2/3 cells in the chain is controlled by a chain length control byte P<n:0> having n+1 bits. This control byte is programmable and may vary at a relatively high frequency in the event the MMD 300 is utilized within a fractional-N divider. The most significant bit of the chain length control byte P<n:0> that is set to a logic 1 value determines how many stages of div2/3 cells 310 participate in a division operation. For example, a chain length control byte P<n:0> equivalent to 001x . . . x means that leftmost stages 0, 1, . . . , n−3 participate in division while rightmost stages n−2 and n−1 do not participate and, as explained more fully hereinbelow, remain entirely inactive in a power saving mode. In this manner, the control byte P<n:0> determines the active chain length. In addition, the n−1 OR logic gates perform respective Boolean operations on multiple bits of the chain length control byte P<n:0> to thereby generate a multi-bit stage number control (SNC) byte. Each stage 310 participating in division requires a high level SNC signal, whereas all stages 310 receiving a low level SNC signal are held inactive.

Figure 2:
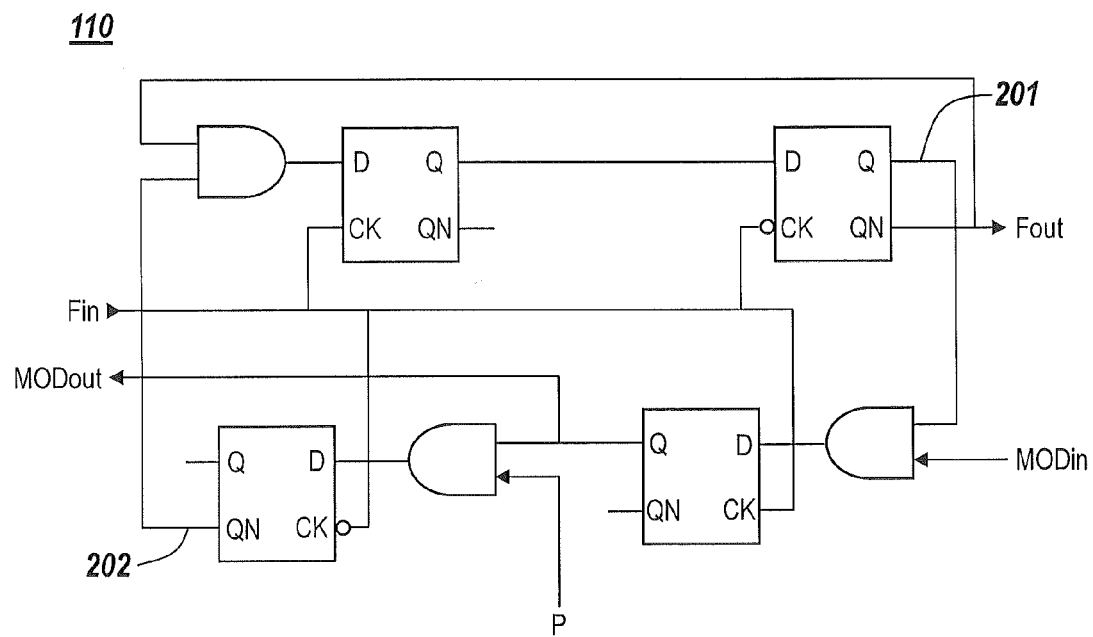
FIG. 2 is an electrical schematic of a div2/3 cell that can be used in the MMD of FIG. 1, according to the prior art.
Figure 4:
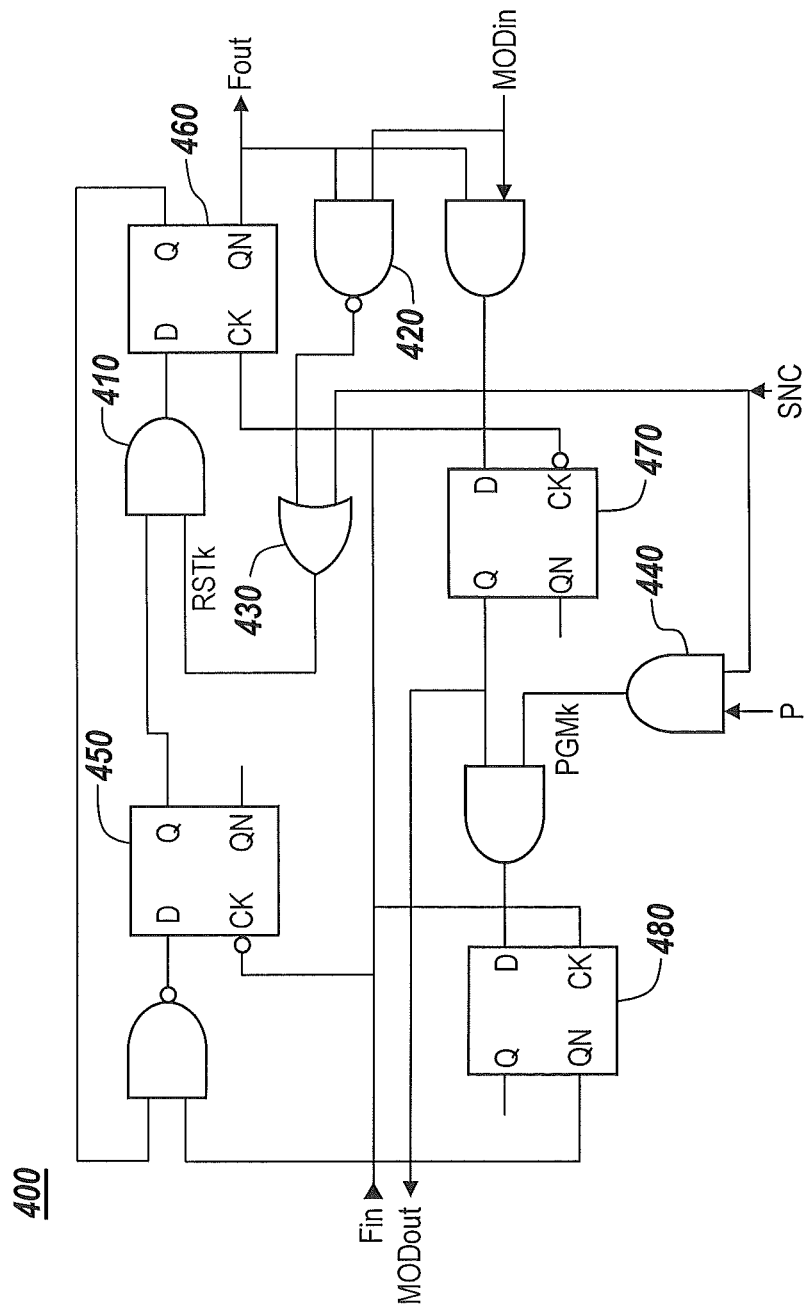
FIG. 4 is an electrical schematic of a div2/3 cell that may be used in the MMD of FIG. 3, according to an embodiment of the present invention.

FIG. 4 illustrates an embodiment of a div2/3 cell 400 that may be utilized as each of the stages 310 within the multi-modulus divider 300 of FIG. 3. As shown, the div2/3 cell 400 includes four D-type level sensitive latches 450, 460, 470 and 480, four AND-type logic gates, two NAND-type logic gates and an OR gate, connected as illustrated. Logic gates 410, 420, 430 and 440 are utilized to perform a chain length control function and support generation of program (PGMk) and reset (RSTk) signals. But, because each participating stage requires a high value (e.g., logic 1) SNC input signal, these four logic gates (410, 420, 430 and 440) do not affect operation of a participating stage, which means an active div2/3 cell 400 can be treated as functionally equivalent to the div2/3 cell 110 of FIG. 2, with the MODin and P<n:0> signals determining whether the active cell supports a divide-by-2 or divide-by-3 function.

Nonetheless, the four logic gates 410, 420, 430 and 440 alter operation of nonparticipating stages so they support substantial power savings and preclude generation of an intermediate divisor during reprogramming. In particular, if there is a div2/3 cell that receives a low level SNC input signal, then it does not participate in any division operation because AND gate 440 outputs a logic 0 value and latch 480 outputs a QN signal that is held at a logic 1 value. In addition, because the rightmost div2/3 cell 310 of FIG. 3 receives a modulus input signal MODin that is always held at a logic 1 value, whenever Fout switches to a logic 1 value, NAND gate 420 outputs a logic 0 signal along with the output of NOR gate 430 and the output of AND gate 410. The latch 460 also outputs a Q=0 and QN=1, which causes the cell to become locked-up with Fout=1 and all D-type latches 450, 460, 470 and 480 being frozen in a power saving mode. The modulus output signal MODout is also set to a logic 1 value, which enables the div2/3 cell immediately to its left in the chain to function properly. In this manner, the multi-modulus divider is self-adaptive so that all stages not participating in a division operation are automatically turned off and, advantageously, there are no switching signals in those stages, which provides power savings. More importantly, the self-adaptive operation of the MMD 300, as described herein, means there is no intermediate divisor when the bits of the chain length control byte P<n:0> change their value to support a fractional-N division operation.

The above-described features of the div2/3 cell 400 and MMD 300 demonstrate that the modulus input signal MODin is not utilized to provide chain length control. Instead, the modulus input signal MODin is only utilized to propagate positive pulses that support a proper division operation. With this change, there is provided a relatively wide and well-defined update time interval for applying changes to P<n:0>, which eliminates any generation of an intermediate divisor. This time interval (i.e., valid update "window") applies to the period when all the modulus input signals MODin for active stages are at a logic 0 value. If the changes to P<n:0> occur during this valid time interval, then a next division operation will occur using the updated P<n:0>, which sets the new divisor.

Figure 5:
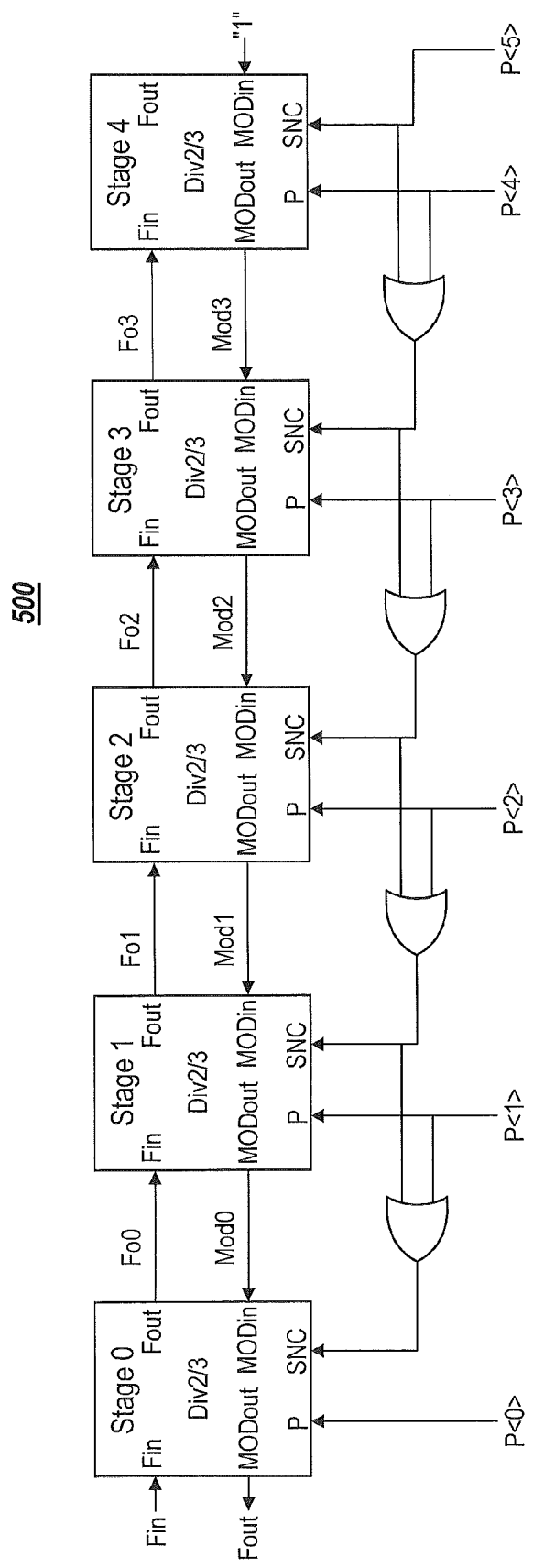
FIG. 5 is an electrical schematic of a 5-stage multi-modulus divider (MMD) according to an embodiment of the present invention.
Figure 6:
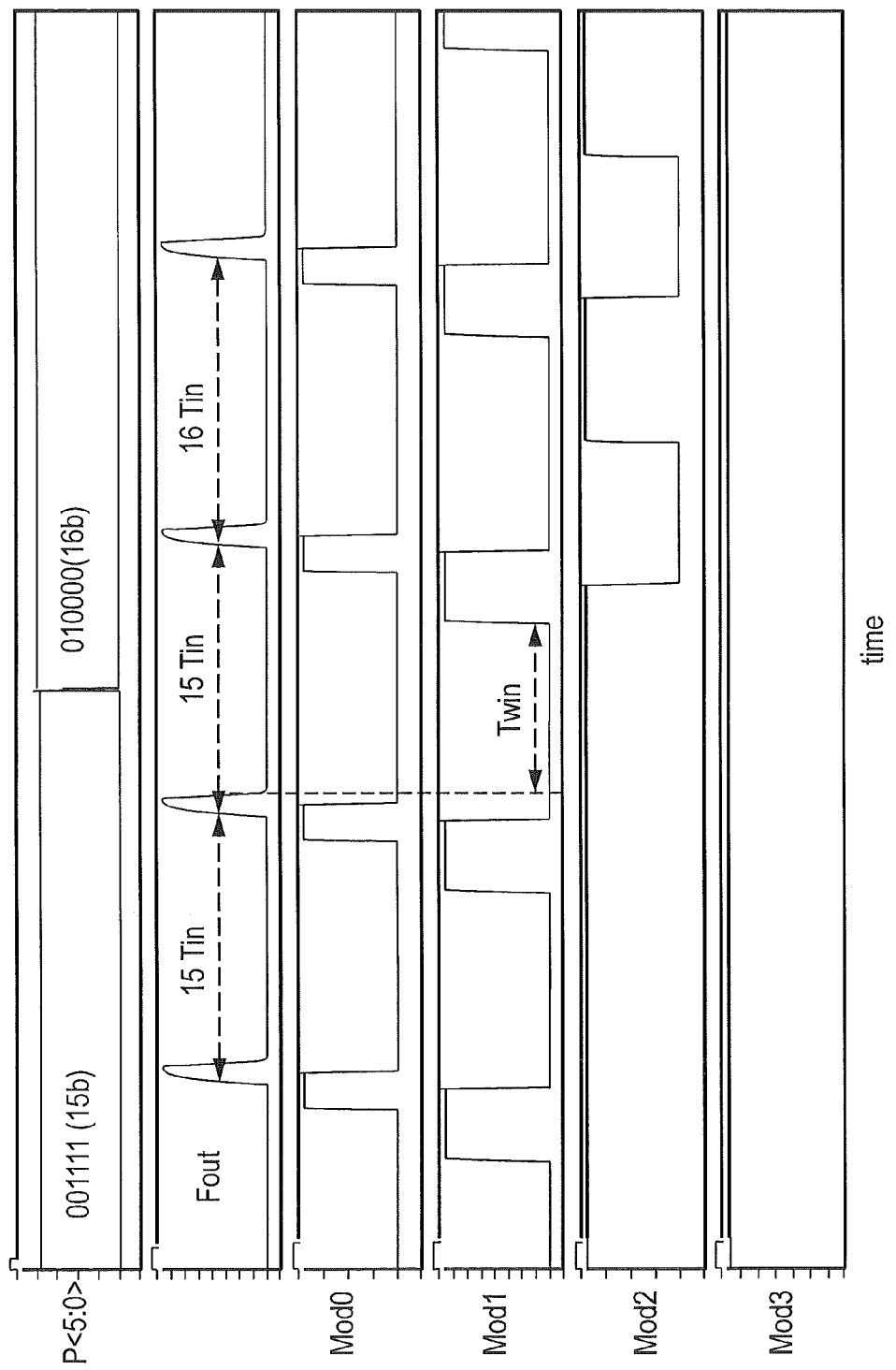
FIG. 6 is a timing diagram that illustrates a chain length control operation within the MMD of FIG. 5, according to an embodiment of the invention.

The above-described aspects and advantages of embodiments of the invention will now be highlighted by the 5-stage multi-modulus divider 500 of FIG. 5, which contains a cascaded chain of the div2/3 cells 400 of FIG. 4 and is responsive to a 6-bit chain length control byte P<5:0>, and the timing diagram of FIG. 6. This 6-bit chain length control byte P<5:0> supports divisors in a range of [2,63] and the timing diagram of FIG. 6 illustrates a change in the chain length control byte P<5:0> from 001111 (15 b) to 010000 (16 b), which yields a frequency output signal Fout having a frequency equal to $1/15^{th}$ Fin when only stages 0, 1 and 2 are active to generate Mod0 and Mod1 pulses, followed by Fout=$1/16^{th}$ Fin when only stages 0, 1, 2 and 3 are active to generate Mod0, Mod1 and Mod2 pulses. As shown by FIG. 6, a falling edge of Fout from the leftmost stage (Stage 0) may commence the valid update time interval (valid time window ($T_{win}$)) during which a new chain length control byte P<n:0> may be loaded (without generation of any intermediate divisor) and a leading edge of the next Modn pulse may terminate this update time interval.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
a multi-modulus divider comprising a cascaded chain of div2/3 cells configured to support a chain length control operation that precludes generation of an intermediate divisor in response to a change in value of a chain length control byte during an update time interval and freezes one or more of the div2/3 cells not participating in a divide-by-N operation in a power saving mode of operation, where N is a positive integer greater than one; each of a plurality of the div2/3 cells in the cascaded chain has a first terminal responsive to a respective bit of the chain length control byte and a second terminal responsive to a respective bit of a multi-bit stage number control (SNC) byte; and each of a plurality of bits of the SNC byte is derived exclusively from a respective Boolean combination of a plurality of bits of the chain length control byte.

2. The device of claim 1, wherein each of the div2/3 cells includes a modulus input terminal and a modulus output terminal; and wherein each of the div2/3 cells is configured so that the chain length control operation is independent of the magnitude of the signals provided to the modulus input terminals of the div2/3 cells.

3. The device of claim 2, wherein a modulus input terminal of each of a plurality of the div2/3 cells is directly connected to a modulus output terminal of another one of the plurality of div2/3 cells.

4. The device of claim 1, wherein each of the plurality of bits of the SNC byte is derived from a respective Boolean combination of a different number of bits of the chain length control byte.

5. The device of claim 1, wherein at least one of the Boolean combinations of a plurality of bits of the chain length control byte includes a logical OR combination of two bits of the chain length control byte.

6. An integrated circuit device, comprising:
a multi-modulus divider comprising a cascaded chain of div2/3 cells configured to support a chain length control operation that precludes generation of an intermediate divisor in response to a change in value of a chain length control byte during an update time interval and freezes one or more of the div2/3 cells not participating in a divide-by-N operation in a power saving mode of operation, where N is a positive integer greater than one, said cascaded chain comprising a plurality of div2/3 cells having respective stage number control (SNC) terminals that receive respective SNC signals, which are each derived exclusively from respective Boolean combinations of a plurality of bits of the chain length control byte.

7. The device of claim 6, wherein each of the div2/3 cells includes a modulus input terminal and a modulus output terminal; and wherein each of the div2/3 cells is configured so that the chain length control operation is independent of the magnitude of the signals provided to the modulus input terminals of the div2/3 cells.

8. The device of claim 7, wherein a modulus input terminal of each of a plurality of the div2/3 cells is directly connected to a modulus output terminal of another one of the plurality of div2/3 cells.

9. The device of claim 8, wherein said multi-modulus divider is configured so that all switching components within the div2/3 cells in said cascaded chain that do not participate in division in response to the chain length control byte remain static in a power saving mode of operation.

10. The device of claim 6, wherein said multi-modulus divider is configured so that all switching components within the div2/3 cells in said cascaded chain that do not participate in division in response to the chain length control byte remain static in a power saving mode of operation.

11. An integrated circuit device, comprising:
a multi-modulus divider comprising a cascaded chain of div2/3 cells configured to support a chain length control operation that precludes generation of any intermediate divisor in response to a change in value of a chain length control byte during an update time interval when all modulus input signals (MODin) associated with active ones of the div2/3 cells participating in a divide-by-N operation are in a first logic state, where N is a positive integer greater than one; each of a plurality of the div2/3 cells in the cascaded chain has a first terminal responsive to a respective bit of the chain length control byte and a second terminal responsive to a respective bit of a multi-bit stage number control (SNC) byte; and each of a plurality of bits of the SNC byte is derived exclusively from a respective Boolean combination of a plurality of bits of the chain length control byte.

12. The device of claim 11, wherein during the update time interval all MODin signals associated with inactive ones of the div2/3 cells not participating in the divide-by-N operation are held in a second logic state, opposite the first logic state.

13. The device of claim 1, wherein a first one of the Boolean combinations of a plurality of bits of the chain length control byte includes a logical OR combination of only two bits of the chain length control byte; and wherein a second one of the Boolean combinations of a plurality of bits of the chain length control byte includes a logical OR combination of only three bits of the chain length control byte.

14. The device of claim 1, wherein each of the plurality of div2/3 cells in the cascaded chain comprises circuitry configured to perform a logical AND operation on signals received at the respective first and second terminals thereof.

15. The device of claim 14, wherein the circuitry includes an output terminal electrically connected to a program node (PGMk) of the first one of the div2/3 cells.

16. The device of claim 14, wherein the circuitry performs a 2-input logic AND operation.

17. The device of claim 1, wherein the chain length control byte is a multi-bit signal defined as: P<n:0>, where n is an integer greater than 3; wherein a first terminal of a first of the div2/3 cells in the cascaded chain is responsive to P<0>; and wherein a second terminal of the first of the div2/3 cells in the cascaded chain is responsive to a bit of the SNC byte having a logic value equal to: P<1> OR P<2> OR . . . P<n−1> OR P<n>, where OR designates a logical OR operation.

18. The device of claim 11, wherein the chain length control byte is a multi-bit signal defined as: P<n:0>, where n is an integer greater than 3; wherein a first terminal of a first of the div2/3 cells in the cascaded chain is responsive to P<0>; and wherein a second terminal of the first of the div2/3 cells in the cascaded chain is responsive to a bit of the SNC byte having a logic value equal to: P<1> OR P<2> OR . . . P<n−1> OR P<n>, where OR designates a logical OR operation.

\* \* \* \* \*